United States Patent
Dai

(10) Patent No.: US 7,402,362 B2
(45) Date of Patent: Jul. 22, 2008

(54) METHOD AND SYSTEM FOR REDUCING AND MONITORING PRECIPITATED DEFECTS ON MASKING RETICLES

(75) Inventor: Yi-Ming Dai, Hsin-Chu (TW)

(73) Assignee: Taiwan Semiconductor Manufacturing Co., Inc., Hsin-Chu (TW)

( * ) Notice: Subject to any disclaimer, the term of this patent is extended or adjusted under 35 U.S.C. 154(b) by 443 days.

(21) Appl. No.: 10/787,698

(22) Filed: Feb. 26, 2004

(65) Prior Publication Data
US 2005/0191563 A1    Sep. 1, 2005

(51) Int. Cl.
*G03F 7/00* (2006.01)
*B08B 5/00* (2006.01)
(52) U.S. Cl. .................. 430/5; 430/322; 134/1; 134/34
(58) Field of Classification Search .............. 430/322, 430/5; 134/1, 2, 42, 902, 200, 33
See application file for complete search history.

(56) References Cited

U.S. PATENT DOCUMENTS

| 6,279,249 | B1 | 8/2001 | Dao et al. |
| 6,280,886 | B1* | 8/2001 | Yan .................. 430/5 |
| 6,327,021 | B1* | 12/2001 | Higashiguchi ............ 355/30 |
| 6,589,354 | B2* | 7/2003 | Reid ................ 134/1 |
| 2002/0083957 | A1* | 7/2002 | Reid ................ 134/1 |
| 2003/0207182 | A1* | 11/2003 | Shirasaki ............ 430/5 |
| 2005/0106737 | A1* | 5/2005 | Kishkovich et al. .......... 436/55 |
| 2006/0201848 | A1* | 9/2006 | Lin et al. .................. 206/711 |

* cited by examiner

*Primary Examiner*—Mark F. Huff
*Assistant Examiner*—Caleen O. Sullivan
(74) *Attorney, Agent, or Firm*—Duane Morris, LLP

(57) ABSTRACT

A method and system is disclosed for reducing and monitoring precipitated defects on mask reticles. A predetermined gas is provided into an environment surrounding the reticle assembly for reducing a formation of the precipitated defects around the mask reticle caused by photolithography under a light source having a small wavelength.

25 Claims, 7 Drawing Sheets

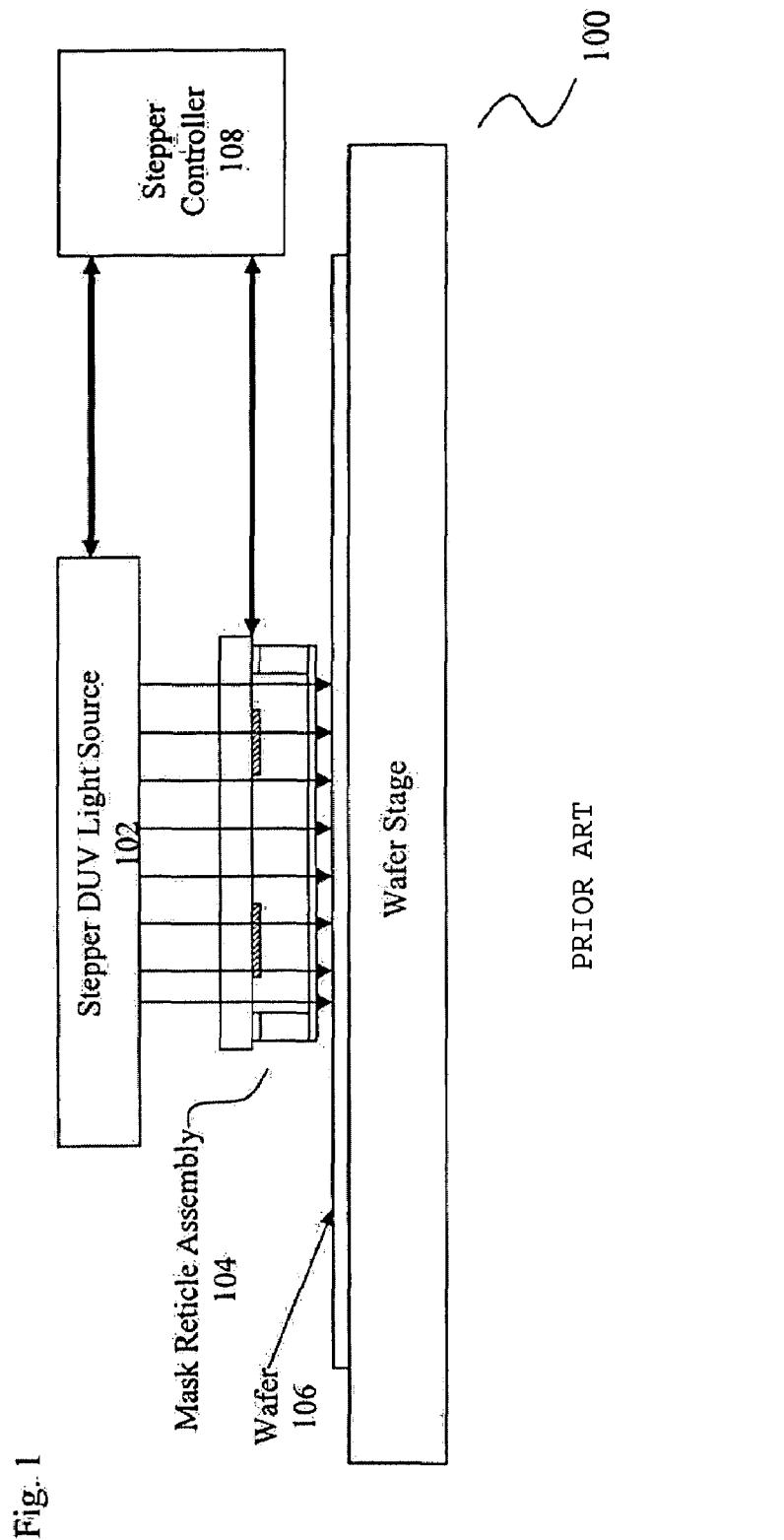

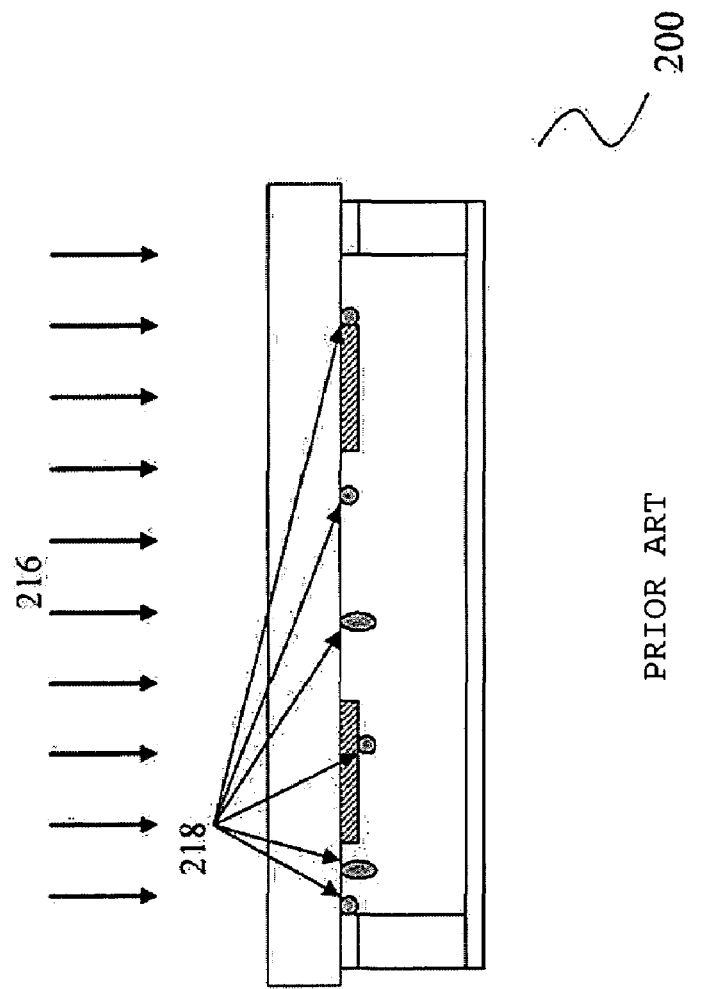

METHOD AND SYSTEM FOR REDUCING AND MONITORING PRECIPITATED DEFECTS ON MASKING RETICLES

BACKGROUND

The present disclosure relates to the fabrication of high performance integrated circuits, and more particularly, relates to methods for reducing and monitoring of precipitated defects on the masking reticles used for the photolithography processes.

The manufacture of very large-scale integrated (VLSI) circuits requires the use of many photolithography process steps to define and create specific circuits on the semiconductor wafer (substrate) surface. A conventional photolithography system comprises of several basic subsystems such as a light source, optical transmission elements, transparent photo mask reticles, and electronic controllers. The system is used to project a specific circuit image, defined by the mask reticle, onto a semiconductor wafer coated with a light sensitive film (photoresist) coating. After image exposure, the film is then developed leaving the printed image of the circuit on the wafer. As VLSI technology advances to higher performance, circuits become geometrically smaller and more dense.

Advancements to photolithography processing were required. The implementation of very short wavelength (<300 nanometers) light in the deep ultraviolet (DUV) spectrum for use as the exposure source was required for successful printing of the smaller, high performance circuits. FIG. 1 illustrates a simple diagram of a conventional DUV photolithography system comprised of a DUV light source 102, mask reticle assembly 104, production wafer 106 and the system controllers 108.

A major issue with the shrinking geometries of the new technologies is precipitated defects. As device features shrink, the minimum size threshold for defects that either disturb or kill device/circuit performance shrinks as well. Photolithography systems are very much affected by such defects. Defects that fall or grow upon on the mask reticle may cause false, broken and defective images to be printed onto the semiconductor wafer. These defective images may render the entire circuit useless.

FIG. 2A illustrates a detailed view of a conventional mask reticle assembly 200. The reticle assembly comprises a mask reticle including a transparent reticle blank 202 with a thin opaque, metal film pattern 204 adhered to one side. This opaque pattern is the circuit image (reticle pattern) that is projected and exposed onto the production wafer. Mask reticle assembly 200 further includes a pellicle frame assembly 205 covers the reticle's metal pattern 204. This structure 205 features a transparent pellicle film 206, aligned parallel to the reticle pattern, with side support frames 208 that are attached to the outer edges of the reticle blank 202 via adhesive 210, to complete the enclosure covering the metal film pattern 204.

During the normal usage and handling of the mask reticle assembly 200 precipitated defects may collect and grow onto the assembly, both outside the reticle pattern 204 and pellicle frame 205, as well as inside the volume confined by the reticle blank 202 and pellicle frame. Certain defect accumulation may occur as a result of continued usage and handling of the assembly. Precipitated defects may be caused by air-borne contamination from the environment, pellicle glue, reticle pod outgassing, pellicle frame H2SO4 residue, from chemical growth and deposition from the reactions, and from the mixing of residual chemical fumes. To avoid high levels of product wafer defectivity and low yield, the mask reticle assembly 200 must be periodically disassembled and subjected to detailed time-consuming, expensive cleaning processes and/or replacements prior to reassembly for reuse.

Common chemicals used for cleaning the reticle's metal pattern are solutions based upon ammonia/ammonium, strong bases, and sulfates from strong (sulfuric) acids. Despite rigorous water rinsing after cleaning in the above solutions, minute residuals of the ammonia and sulfate ions may still remain on the reticle assembly components. The pellicle frame 205 enclosure around the metal pattern 204 is efficient for protecting the reticle from exterior precipitated defects. However, it is likely to trap the minute ammonia and sulfate residual ions inside the pellicle frame 205 near the reticle pattern 204. FIG. 2A illustrates these areas within and outside the reticle mask assembly 200. The confined volume 212 may contain higher concentrations of ammonia and/or sulfate ions than the areas 214 outside of the assembly 200. The high concentration of such chemical ions in the area 206 in such a close proximity to the reticle pattern 204 is not desirable. The mixture of such ions within the enclosed volume 212 and the slow inward diffusion of trace chemicals from the exterior environment through the pellicle frame 205 may slowly cause chemical precipitated defects to deposit and grow onto the reticle's metal pattern 204. For example, the reaction of ammonia and sulfate ions will produce ammonium sulfate precipitated defects.

It is also noted that ammonia/ammonium based chemicals and sulfuric acid are commonly used in other operations of IC fabrication. These other operations may be additional environmental sources for such contamination to migrate into the volume enclosed by the reticle blank 202 and pellicle frame 205. Furthermore, as the mask reticle is continuously used in the photolithography production, energy supplied from the light source may accelerate and promote precipitated defect growth. In time, the defects will grow to significant size and quantity, enough to cause defective printed patterns and low circuit yield. This phenomenon is illustrated in FIG. 2B. The reticle mask assembly 200 is shown with DUV light 216 exposure turned on. Precipitated defects 218 are shown growing and depositing upon or near the reticle pattern.

Although the pellicle frame 205 enclosing the reticle pattern 204 is not hermetically sealed, evacuation of the undesired chemical fumes is hard to control or can not be ascertained. Accordingly, it is desirable to have a controlled method for reducing the formation of the precipitated defects.

SUMMARY

A method and system is disclosed for reducing and monitoring precipitated defects on mask reticles.

In one example, a predetermined gas is provided into an environment surrounding the reticle assembly for reducing a formation of the precipitated defects around the mask reticle caused by photolithography under a light source having a small wavelength.

In another example, for reducing precipitated defects trapped within at least one mask reticle assembly, the mask reticle assembly is placed in a reticle storage pod. A predetermined gas is introduced into the reticle storage pod, wherein undesired ions are thus purged from the mask reticle assembly for reducing the undesired precipitated defects trapped within the mask reticle assembly.

These and other aspects and advantages will become apparent from the following detailed description, taken in conjunction with the accompanying drawings, illustrating by way of example the principles of the disclosure.

BRIEF DESCRIPTION OF THE DRAWINGS

FIG. 1 is a block diagram of a conventional photolithography system showing the basic system components.

FIGS. 2A and 2B are sectional side views of a conventional mask reticle assembly.

DESCRIPTION

The present disclosure describes a method for reducing and monitoring precipitated defects deposited and grown onto the mask reticles used in photolithography processes during the fabrication of integrated circuits.

Figure 2A:
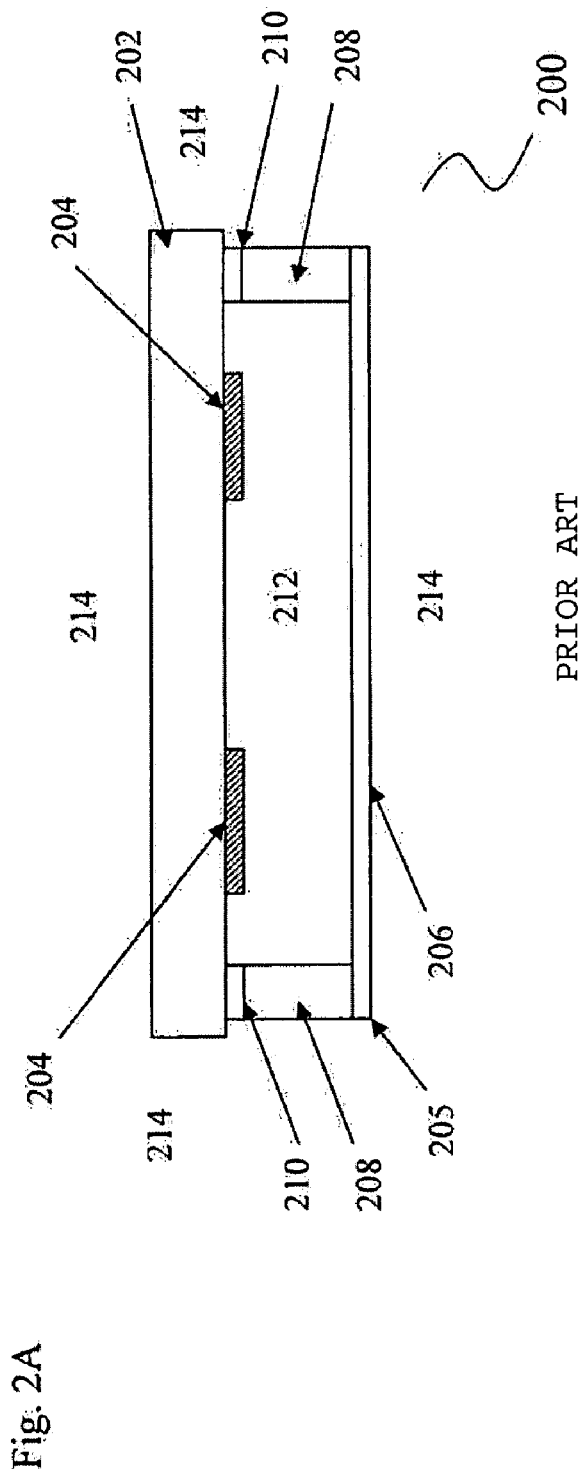
Figure 3A:
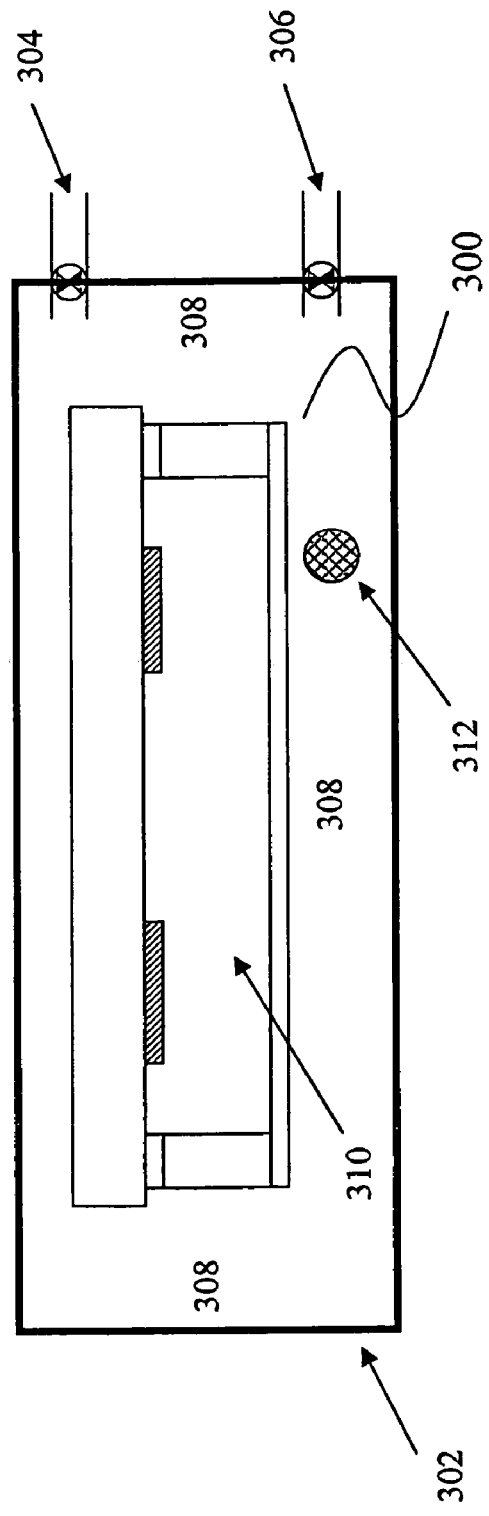
FIGS. 3A and 3B are sectional side views of an enclosed mask reticle assembly in accordance to one example of the present disclosure.

Referring now to FIG. 3A, there is shown a sectional side view of an enclosed mask reticle assembly 300 in accordance to one example of the present disclosure. The mask reticle assembly 300 is enclosed within a storage structure known in the present disclosure as a reticle storage pod 302, or simply, reticle pod. The mask reticle assembly 300 can be secured to the reticle pod 302 by an enclosed holding fixture (not shown). Various holding and locking mechanisms can be used for the purpose of holding the mask reticle assembly 300 in a predetermined location. The reticle assembly 300 is typically stored in a reticle pod 302 when it is either not installed onto the photolithography equipment or undergoing it's assembly, cleaning and/or maintenance operations. There are valved exterior gas inlet 304 and gas outlet 306 fixtures of the pod. By using the pod's gas fixtures 304 and 306, a predetermined gas such as nitrogen may be introduced into the pod 302 enclosed reticle assembly 300 to displace its atmospheric environment. The displacement of the gaseous environment 308 surrounding the reticle assembly 300 with inert gas (gases) will induce the residual ammonia and sulfate chemical ions or gas to diffuse out of the reticle mask region 310 enclosed by the pellicle frame assembly 205, to the exterior of the mask reticle assembly 300. The evacuated chemical ions are then subsequently purged out of the reticle pod 302 through the pod's gas outlet fixture 306. Fick's Laws of Diffusivity will cause the low minute concentrations of chemical ions in the enclosed reticle mask region 310 to be rapidly purged out into the high concentration region 308 of inert gas and eventually out through the gas outlet 306. As a result, the enclosed reticle mask region 310 will have little or no chemical ions that produce precipitated defects and the reticle pattern will be free of precipitated defects.

It is desired to start the inert gas purge process of the mask reticle assembly as soon as possible after completion of the reticle assembly's cleaning process to minimize the formation of precipitated defects. When it is not necessary to maintain a continuous purge, the reticle pod's inlet 304 and outlet 306 valves may be used to turn off the purging process to seal the reticle assembly in the inert gas environment. Filtering mechanisms can be used at the outlet 306 to collect the impurity materials such as ammonium sulfate. If pipes are used that connects to the outlet 306, a filter can be designed to be placed at either end of the pipe. In another example, inert gas filled reticle pods may be used to store the reticle assemblies when it is either not installed onto the photolithography production system or undergoing it's assembly, cleaning and/or maintenance operations.

Figure 3B:
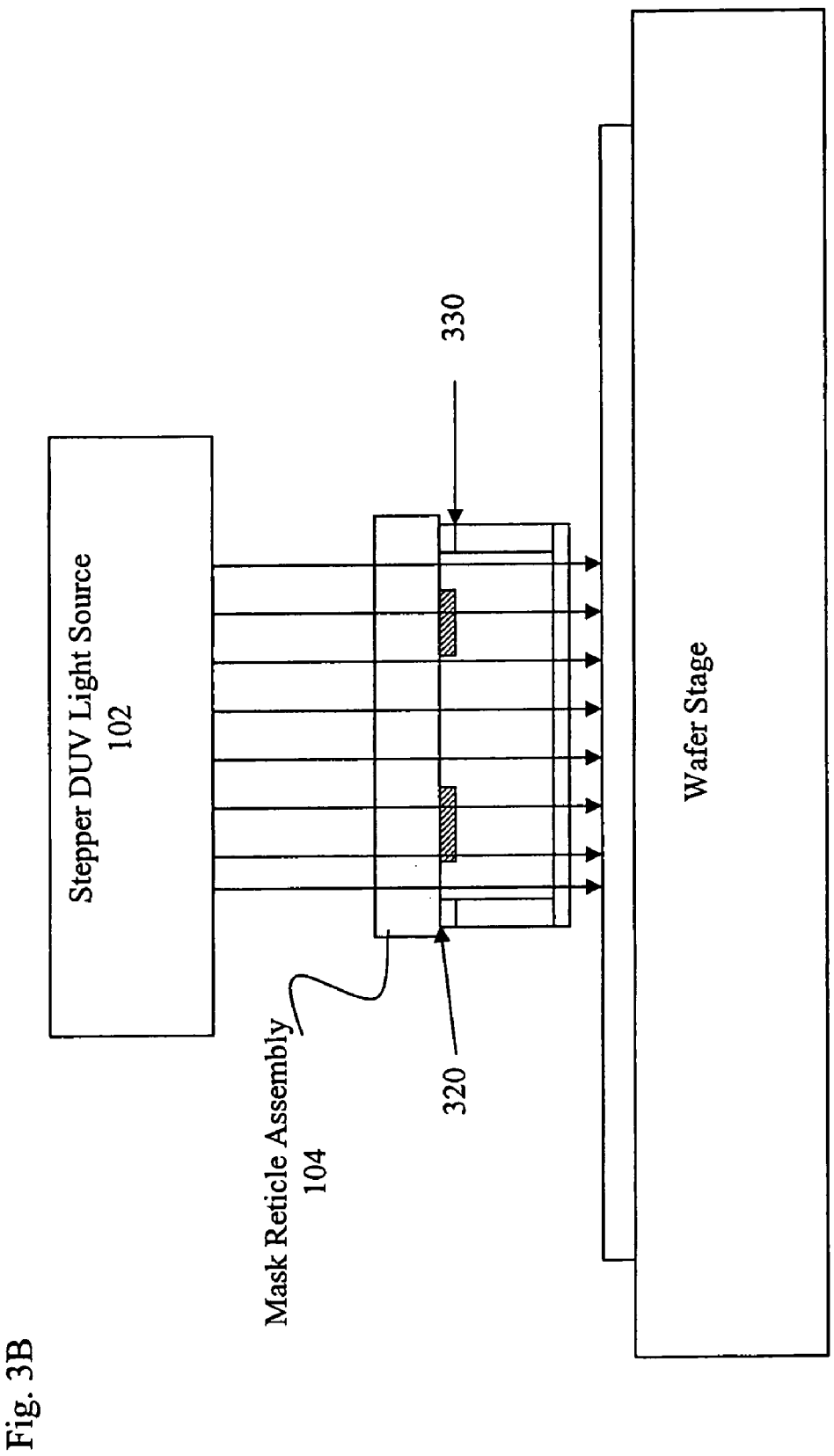

FIG. 3B illustrates a method for purging the undesired defects during a semiconductor processing operation. In this operation in which the mask is used under a DUV light source, precipitated defects are likely to be trapped in the mask reticle assembly 104. The environment of the operation surrounding the assembly 104 is filled with a predetermined pure gas such as $N_2$, or $O_2$, or an inert gas such as Ar, or even a gas mixture such as NO compound. For example, through the adhesive 210 on the edges of the assembly, the gas $N_2$, diffuses into the assembly. Since $SO_2$ under UV light and $O_2$ will generate $H_2SO_4$ with moisture, which in turn causes defects such as $(NH4)_2SO_4$, when $N_2$ is filled in the assembly, $NH_3$ and/or $SO_2$ is more likely to diffuse out from the adhesive areas of the assembly. It is understood that with different environment controls, a predetermined gas or gas mixture can fill the assembly with a dominant amount, or can have sufficient flow to purge the gaseous interior of the assembly, or in any way dilute the chemical content in the assembly in order to reduce the likely of forming the defects. As known in the industry, pressure can be used as a main control mechanism to achieve the expected goals. The pressures can be fixed, or varied based on the needs.

Figure 4A:
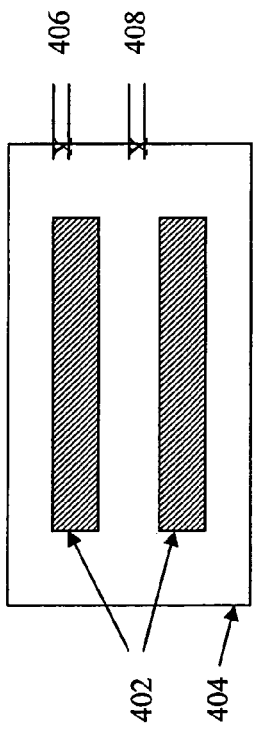
FIGS. 4A through 4C are block diagrams illustrating different examples of mask reticle storage according to the present disclosure.
Figure 4B:
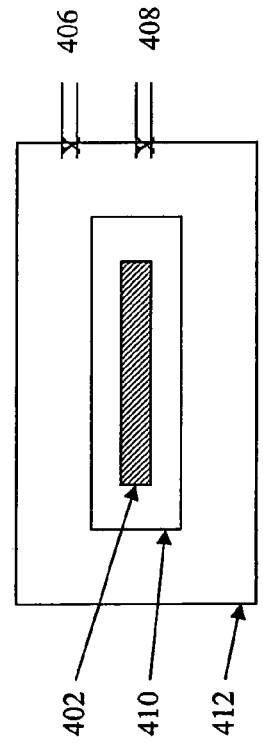
Figure 4C:
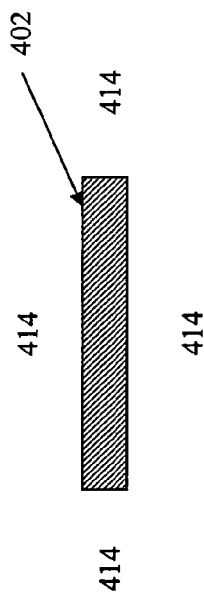

Features of the present disclosure may also be incorporated into other existing systems of reticle mask storage and containment. FIGS. 4A through 4C illustrate examples for several systems. FIG. 4A illustrates multiple reticle mask assemblies 402 enclosed by a single reticle pod 404 with the pod's inert gas inlet 406 and gas outlet 408 installed onto the pod. FIG. 4B illustrates a reticle mask assembly 402 enclosed by an additional reticle pod 410. In addition, an exterior pod 412 encloses this reticle pod 410. Inert gas inlet 406 and outlet 408 are installed onto the exterior pod 410 instead of being installed onto the reticle pod 410.

FIG. 4C illustrates an example of the present disclosure without the use of pods. For this example, the inert gas concentration 414 outside of the reticle mask assembly 402 is maintained high by some well known means. This example does not require the use of a pod.

Figure 5:
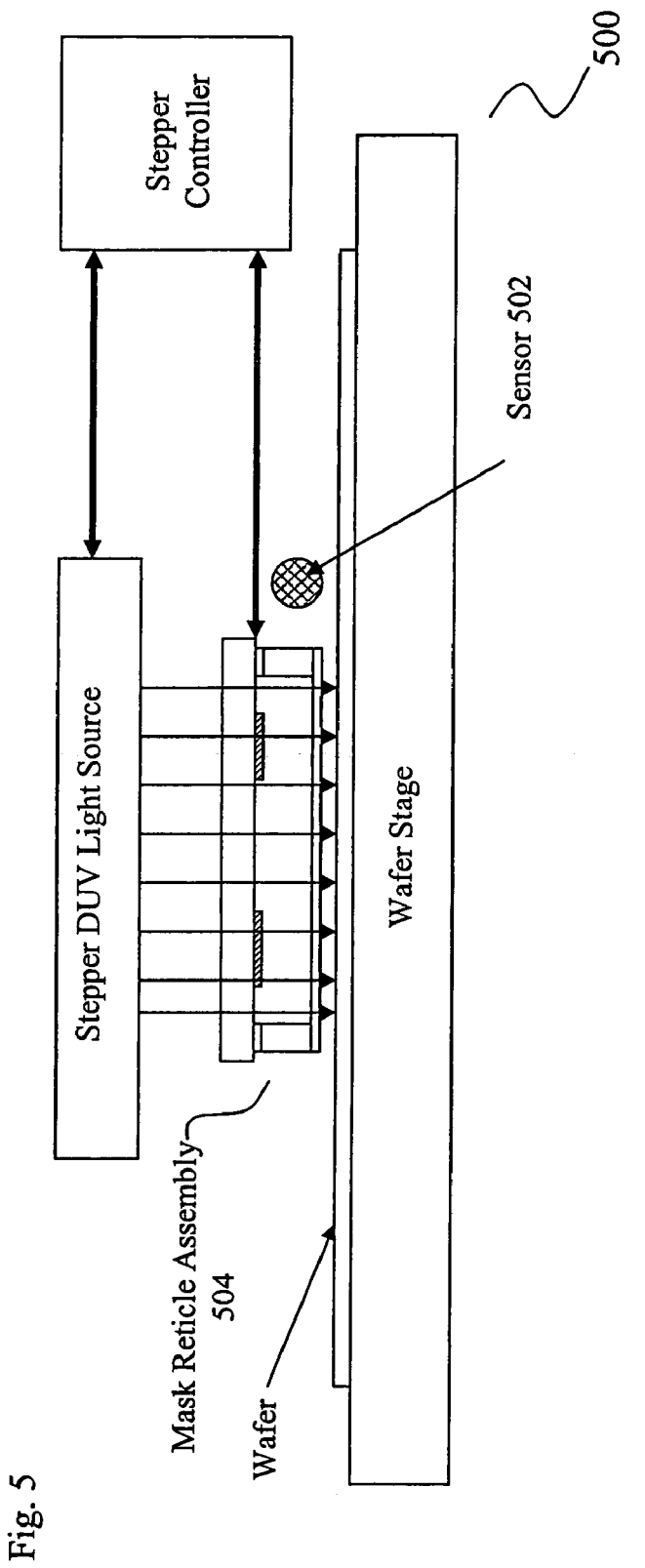
FIG. 5 illustrates a conventional photolithography system showing components of the basic system with a residual chemical trace detector situated in accordance to the example of the present disclosure.

FIG. 5 is an illustration of a photolithography system 500 with a chemical sensor 502 incorporated to monitor residual chemical fumes diffusing out of the mask reticle assembly 504 in accordance with the present disclosure. This sensor 502 is located at a predetermined position adjacent to the installed mask reticle assembly 504. The sensor is specifically sensitive to, in a real time fashion, amine (ammonia/ammonium) compounds and capable of discerning and recording data for trace levels below a certain threshold value measured in parts per billion (ppb). The generated data may be transmitted to a control subsystem such as a monitor/recording subsystem (not shown), which may be interfaced to either an independent external feedback subsystem to control the gas inlet and outlet fixtures, or to an existing photolithography control systems (also not shown).

By monitoring the amine levels diffusing out of the reticle assembly 504, correlation to precipitated defect formation can be established. The correlation data may be used to determine alarm/alert levels for an integrated control system according to the defectivity and yield tolerances of the product wafers. A typical alarm threshold setting of the amine sensor may be 0.15 ppb, for monitoring of amine levels during active photolithography operations when the DUV light energy is applied. If the sensed amine levels are below 0.15 ppb, it is suggested that the mask reticle assembly 404 has been sufficiently purged and that precipitated defect deposit and growth is very unlikely. Sensed amine levels above 0.15 ppb indicate that precipitated defect deposit and growth is very likely to occur. Integrated control systems (not shown) may be programmed to halt the photolithography operation, restrict further use of the affected reticle assembly 500, and/or signal some other appropriate actions when the preset threshold has been breached.

It is noted that this sensing/monitoring methodology may also be applied to monitor the purging operations of the reticle pods. Referring back to FIG. 3A, it also illustrates the use of a sensor 312 installed within the reticle pod 302 to sense amine levels therein. Alternatively, the use of various sensors for sensing non-amine chemical residual ions may be used in addition to, or in lieu of amine sensors for monitoring precipitated defect formation and purge effectiveness.

It is understood that the precipitated defect deposition and growth upon the reticle pattern may be controlled and greatly reduced according to the above disclosure. The use of a selected gas to purge the environment surrounding the mask reticle assembly will cause the source chemicals for precipitated defect formation to diffuse out of the reticle mask region. The resulting low-defect and/or defect-free reticle mask patterns will produce less amount of defective wafers through the photolithography operations and less amount of wafers requiring rework for defective patterns, thereby improving overall operational productivity for the photolithography operations. Low-precipitated defect and precipitated defect-free reticle masks will also reduce the frequency interval for their required disassembly and cleaning, thereby increasing overall reticle mask usage life, preserving pattern integrity from excessive cleanings, reducing costs from related operations. It is further understood that the precipitated defects is a considerable concern for using masks under a photolithography process with a light source having a small wavelength such as around or below 300 nm. Although the method described above can be used with any photolithography processes, but it is more needed for the process using small wavelength light sources.

The examples illustrated in accordance with the present disclosure are easily incorporated into currently existing IC fabrication operations. It is also noted that the methodology used in accordance with the present disclosure is applicable to future generations of photolithography systems and process technologies, as well as to the older systems and technologies.

The addition of a chemical sensor helps to monitor and characterize the precipitated defect formation and the inert gas purge process. The sensor may be used either in real time as a control tool for defectivity control of the photolithography operations and/or for checking the effectiveness of the reticle pod purge operations.

The above disclosure provides many different embodiments, or examples, for implementing different features of the invention. Specific examples of components, and processes are described to help clarify the invention. These are, of course, merely examples and are not intended to limit the invention from that described in the claims.

While the invention has been particularly shown and described with reference to the preferred embodiment thereof, it will be understood by those skilled in the art that various changes in form and detail may be made therein without departing from the spirit and scope of the invention, as set forth in the following claims.

What is claimed is:

1. A method for reducing precipitated defect formation within a sealed mask reticle assembly containing a mask reticle, the method comprising:

providing a mask reticle assembly having a sealed pellicle frame defining an enclosed volume and including at least one mask reticle therein, the pellicle frame including a transparent pellicle film spaced apart from the mask reticle assembly by solid side support frames attached to outer edges of the mask reticle by a gas permeable adhesive, wherein the reticle is sealed inside the pellicle frame;

providing a predetermined gas into an environment surrounding the sealed pellicle frame;

diffusing the predetermined gas through the adhesive into the enclosed volume of the sealed pellicle frame; and diffusing chemical contaminants out from the sealed pellicle frame through the adhesive with the predetermined gas into the environment to reduce the formation of precipitated defects.

2. The method of claim 1 further comprising controlling a pressure of the environment to induce the predetermined gas to diffuse into the mask reticle assembly through the adhesive.

3. The method of claim 1 further comprising filtering the precipitated defects from the sealed pellicle frame.

4. The method of claim 1 wherein the predetermined gas is an inert gas.

5. The method of claim 1 wherein the predetermined gas is a N containing compound gas mixture.

6. The method of claim 1 wherein the predetermined gas is a pure gas comprised of a single element.

7. A method for reducing precipitated defect formation within a sealed mask reticle assembly in applying a photolithography process using a deep ultraviolet (DUV) light source to a semiconductor wafer using a mask reticle assembly the method comprising:

enclosing a mask reticle in a mask reticle assembly having a sealed pellicle frame defining an enclosed volume, the pellicle frame including a transparent pellicle film aligned parallel to and spaced apart from the mask reticle by solid side support frames attached to outer edges of the mask reticle by a gas permeable adhesive, wherein the reticle is sealed inside the pellicle frame;

applying the DUV light source to the mask reticle assembly on a wafer stage; and providing a predetermined gas to an environment of the wafer stage surrounding the mask reticle assembly, wherein the predetermined gas diffuses into the mask reticle assembly through the adhesive to drive out chemical contaminants through the adhesive for reducing the formation of precipitated defects caused by the chemical contaminants trapped in the mask reticle assembly around the mask reticle.

8. The method of claim 7 further comprising monitoring at least one predetermined type of undesired ions diffusing out of the mask reticle assembly.

9. The method of claim 8 wherein the undesired ions are amine ions.

10. The method of claim 7 wherein the predetermined gas is nitrogen based inert gas.

11. The method of claim 7 wherein the predetermined gas is a N containing compound gas mixture.

12. The method of claim 7 wherein the predetermined gas is a pure gas comprised of a single element.

13. The method of claim 12 wherein the pure gas is $O_2$ or $N_2$.

14. The method of claim 7, wherein the DUV light source has a wavelength smaller than about 300 nm.

15. The method of claim 7, further comprising the step of monitoring residual chemical fumes diffusing out of the mask reticle assembly.

16. The method of claim 1, wherein the chemical contaminants diffuse through a gas-permeable adhesive used to construct the mask reticle assembly.

17. The method of claim 1, wherein the environment surrounding the reticle assembly is confined by a physical enclosure.

18. The method of claim 17, wherein the physical enclosure is a reticle pod having a gas inlet and a gas outlet.

19. A method for reducing precipitated defects in a sealed mask reticle assembly comprising:

establishing a confined environment around a mask reticle assembly defining an enclosed region having a mask reticle disposed therein, the mask reticle assembly including a sealed pellicle frame including a transparent pellicle film spaced apart from the mask reticle by solid side support frames attached to outer edges of the mask reticle by a gas permeable adhesive, wherein the reticle is sealed inside the pellicle frame;

flowing a predetermined gas into the confined environment;

diffusing the predetermined gas through the adhesive into the enclosed region of the mask reticle assembly; and diffusing chemical contaminants trapped in the mask reticle assembly from the assembly into the confined environment through the adhesive.

20. The method of claim 19, wherein the confined environment is a reticle pod.

21. The method of claim 19, further comprising the step of expelling the chemical contaminants from the confined environment.

22. The method of claim 19, wherein the chemical contaminants are selected from the group consisting of ammonia ions, sulfate ions, and a combination thereof.

23. The method of claim 19, wherein the mask includes a transparent reticle blank and a metal film pattern disposed on the blank.

24. The method of claim 19, further comprising a step of monitoring chemical fumes diffusing out from the mask reticle assembly for the presence of the chemical contaminants.

25. The method of claim 24, further comprising a step of controlling the flowing of the predetermined gas based on the monitoring step.

* * * * *